United States Patent [19]

Roberts

[11] Patent Number: 5,477,612

[45] Date of Patent: * Dec. 26, 1995

[54] METHOD OF MAKING HIGH DENSITY CONDUCTIVE NETWORKS

[75] Inventor: Joseph A. Roberts, Grafton, N.H.

[73] Assignee: Rock Ltd. Partnership, Grafton, N.H.

[ * ] Notice: The portion of the term of this patent subsequent to Sep. 6, 2011, has been disclaimed.

[21] Appl. No.: 16,002

[22] Filed: Feb. 10, 1993

Related U.S. Application Data

[63] Continuation-in-part of Ser. No. 837,357, Feb. 14, 1992, Pat. No. 5,343,616.

[51] Int. Cl.⁶ .................................................. H05K 3/02
[52] U.S. Cl. ..................... 29/846; 29/469.5; 174/52.2; 174/253; 174/255; 439/67; 439/74; 439/77; 439/85
[58] Field of Search .............................. 29/881, 846, 847, 29/469.5; 174/52.2, 52.4, 253, 254, 255; 439/67, 74, 77, 85

[56] References Cited

U.S. PATENT DOCUMENTS

| | | |
|---|---|---|
| 2,427,144 | 9/1947 | Jansen . |
| 2,638,660 | 5/1953 | Van Gessel . |
| 2,716,268 | 8/1955 | Steigerwalt . |
| 2,837,619 | 6/1958 | Stein . |
| 2,912,745 | 11/1959 | Steigerwalt et al. . |
| 2,912,746 | 11/1959 | Oshry et al. . |
| 2,912,748 | 11/1959 | Gray . |
| 3,147,054 | 9/1964 | Alexander et al. . |
| 3,148,098 | 9/1964 | Beste, Jr. . |
| 3,158,421 | 11/1964 | Hasenauer, Jr. . |
| 3,301,730 | 1/1967 | Spiwak et al. . |
| 3,423,260 | 1/1969 | Heath et al. . |
| 3,434,208 | 3/1969 | Toomey et al. . |
| 3,488,890 | 1/1970 | Owens et al. . |
| 3,612,745 | 10/1971 | Warren . |
| 3,875,542 | 4/1975 | Holland et al. . |
| 3,889,363 | 6/1975 | Davis . |
| 4,020,548 | 5/1977 | Pohl . |
| 4,075,420 | 2/1978 | Walton . |
| 4,080,027 | 3/1978 | Benasutti . |
| 4,089,734 | 5/1978 | Bierig . |
| 4,091,125 | 5/1978 | Delgadillo . |
| 4,246,563 | 1/1981 | Noerholm . |
| 4,272,753 | 6/1981 | Nicolay . |
| 4,306,925 | 12/1981 | Lebow et al. . |
| 4,357,750 | 11/1982 | Ostman . |
| 4,406,062 | 9/1983 | Navarro ................................ 881/29 |
| 4,528,259 | 7/1985 | Sullivan . |
| 4,532,152 | 7/1985 | Elarde . |
| 4,604,799 | 8/1986 | Gurol . |
| 4,651,417 | 3/1987 | Schumacher, III et al. . |
| 4,655,518 | 4/1987 | Johnson et al. . |
| 4,721,550 | 1/1988 | Schumacher, III . |
| 4,775,611 | 10/1988 | Sullivan . |
| 4,840,702 | 6/1989 | Schumacher, III . |
| 5,088,009 | 2/1992 | Harada et al. . |
| 5,097,101 | 3/1992 | Trobough . |
| 5,184,111 | 2/1993 | Pichl . |

FOREIGN PATENT DOCUMENTS

| | | |
|---|---|---|
| 1515382 | 10/1969 | Germany . |
| 2136386 | 2/1973 | Germany . |

OTHER PUBLICATIONS

Action News, Spring/Summer 1990, Action Technologies, Inc. "Molded Flexible Circuits".

*Primary Examiner*—Carl J. Arbes
*Attorney, Agent, or Firm*—Davis, Bujold & Streck

[57] ABSTRACT

A supported conductive network (SCN), which can be flexible or rigid, can have self-aligning conductors which connect with corresponding conductors of other networks. The conductive network can be fabricated into densely packed contact clusters for use as electrical interconnectors or circuits. The methods and apparatus for making the conductive network involve forming a sheet of conductive material into ridges and troughs one of which defines the conductive network and the other of which is waste material and then mechanically removing the waste material. The conductive network thus formed is supported by a dielectric layer.

5 Claims, 5 Drawing Sheets

METHOD OF MAKING HIGH DENSITY CONDUCTIVE NETWORKS

This is a continuation-in-part of application Ser. No. 07/837,357 filed on Feb. 14, 1992 now U.S. Pat. No. 5,343,616 issued Sep. 6, 1994.

This invention generally relates to supported conductive networks (SCN), flexible or rigid, and their manufacture. In particular, this invention relates to such conductive networks which have densely packed conductive paths (HDSCN), and to a method and apparatus for making the conductive networks.

BACKGROUND OF THE INVENTION

Developments in the electronics industry require the use of more densely packed electrical modules and circuits, each requiring multiple interconnections to one another. However, there is a practical limit to the density that can be achieved using conventional connective networks. In a typical present day application, a floppy disk drive may require a connection to a recording head whose conductors are only on the order of 0.2 mm (0.008 inches) on center and associated jumper conductors must have a similar spacing. Further, recent liquid crystal displays have conductors which are even more closely packed, for example, 0.1 mm (0.004 inches) on center, with similar requirements for interconnection conductors. In addition, there is growing use of ceramic PC boards to accommodate multiple IC chip arrays which also require high density connectors and custom interconnect cables for purposes of terminating those components.

As a direct result of the growth in the circuit board industry, there has been a parallel increase in the volume of environmentally-hazardous chemicals generated by the conventional etching and deposition processes. For example, it is not uncommon for one circuit board fabrication facility to generate 4,000 liters (1,000 U.S. gallons) per day of photo resist stripper and 4,800 liters (1,200 U.S. gallons) per week of developer solution. These toxic wastes must be transported off-site for proper disposal at hazardous waste management sites. Thus, there is an urgent need for a non-chemical method for the manufacture of conductive networks.

It is an object of this invention to provide a relatively inexpensive, high-quality, densely packed, supported conductive network for use in fabricating rigid or flexible circuit boards, that can be built without the use or generation of environmentally hazardous chemicals.

Another object of the invention is to provide a flexible conductive network having conductive paths which are profiled to self-align with corresponding conductors of other conductive networks.

Yet another object of the invention is to provide methods of making conductive networks having one or more of the above advantages.

SUMMARY OF THE INVENTION

Simply stated the present invention relies on one basic principle, namely, the creating of a circuit pattern in a planar sheet of conductive material by displacing waste material into a plane where it can be easily removed and then mechanically removing the waste material.

Generally, in this invention, a flexible conductive network is made by shaping an electrically conductive sheet of material (for example, a copper lamina or a laminate of such materials with or without plated on, or inlaid, contact points) to form a desired conductor pattern on the sheet. A forming process forms ridges and troughs of desired cross-sections in the sheet with one of these corresponding to a conductor pattern, Usually a dielectric substrate is then attached or formed to one side of the sheet, for example, with an adhesive filling the spaces between the substrate and the sheet. Alternatively, the dielectric substrate may, in appropriate circumstances form a laminate with the conductive sheet prior to the formation of the ridges and troughs.

Next, the exposed metal face of the metal-dielectric lamination is exposed to a removal process, for example precision milling or grinding to cut away a pre-determined amount of the material to isolate the adjacent conductors of the pattern from one another which thereupon may, if desired, constitute channeled conductive paths attached to the dielectric substrate, each of which has a desired cross-section or profile.

This process offers significant advantages over the conventional imaging and etching or additive (plating-up) techniques normally used to make printed circuit conductive networks. It significantly reduces labor costs and produces improved yields. It also allows the use of metal sheets or foils with minor inclusions which cannot be used in a process involving etching because it would result in non-uniform etch rates. Further, in the process of this invention, the throughput is the same for circuits whose metal foils have different thicknesses. This contrasts to the usual imaging-etching process wherein the line speed is directly proportional to the foil weight because it takes longer to etch thick foil than thin foil. The process of this invention results in additional savings because it is a dry process which does not entail the added expenses related to ancillary processing of hazardous materials and chemical disposal.

According to the invention there is provided a method for manufacturing a supported conductive network comprising the steps of a) forming a planar electrically conductive sheet into a non-planar pattern having a dielectric material fast with a first face thereof; and b) removing portions of the sheet from a second face thereof to form electrically insulated electrically conductive paths supported by the dielectric material.

Also according to the invention there is provided a supported conductive network having self-aligning electrically conductive paths comprising a dielectric layer; and an electrically conductive layer supported by said dielectric layer; said metallic layer being formed into conductive paths electrically insulated from one another, and said conductive paths having outwardly inclined side walls for aiding in aligning said conductive network with conductive contacts of a connecting member.

Also according to the invention there is provided an apparatus for manufacturing a flexible conductive network comprising means for forming a planar electrically conductive sheet into a non-planar pattern with a flexible dielectric material fast to a first face of said sheet and means for removing portions of said metallic sheet from a second face of said sheet to form electrically insulated electrically conductive paths.

The inventive process will yield a rigid circuit (SCN) board or flexible circuit capable of precisely aligning with and maintaining contact with the conductors of a surface mounted device. Typically these devices have conductors located 0.3 mm (0.012 inches) on center or less. This precise alignment is primarily due to the interlocking characteristic of the shaped conductor.

Conductors and their terminating points can, by using the present invention, be designed to any specific electrical parameter or configuration and may be randomly located on any non-conductive base material.

The inventive process also has the advantage of running an SCN production line capable of processing many different conductive materials such as brass, copper, aluminum etc., without fear of chemical contamination of costly chemistry change-over, common with conventional etching systems.

The following is intended to summarize the versatility and technical advantages of the inventive (DryFlex) process:

a) The Dryflex process is equally effective on high volume and intermediate volume jobs;

b) Once the electrical and mechanical characteristics of a circuit are established and built into the hardened steel template, there is circuit repeatability;

c) Conductors can be plated with any surface finish;

d) Base laminate may be fused (melted) to the formed conductive sheet eliminating the need for an adhesive (This an only be accomplished, without causing conductor distortion (swim), using the Dryflex process);

e) The Dryflex process eliminates common yield problems associated with conventional etched circuits such as, artwork distortion, dirt or dust, scratched resist, inconsistent etching chemistry, etc;

f) The Dryflex process offers a significant reduction in direct labor;

g) The Dryflex process eliminates chemical processing materials and related disposal expenses;

h) The ability to produce conventional copper circuit for less than ½ of direct manufacturing costs using etching techniques;

i) The ability to manufacture low cost, channelled conductors insulated with any flexible or rigid insulating material;

j) The ability to manufacture low cost, channelled conductors insulated and mounted to a second SCN and/or to a support spring or component stiffener; and k) The DryFlex process can be used to make high-density contact clusters for connector assemblies.

BRIEF DESCRIPTION OF THE DRAWINGS

The invention will now be described, by way of example, with reference to the accompanying drawings, in which:

FIG. 1 is a fragmentary axonometric view of a self-aligning conductive network (SCN) made in accordance with the invention and shown coupled to a printed circuit;

FIG. is a sectional view taken along lines 2—2 of FIG. 1;

DETAILED DESCRIPTION OF PREFERRED EMBODIMENTS OF THE INVENTION

Figures 1, 2:
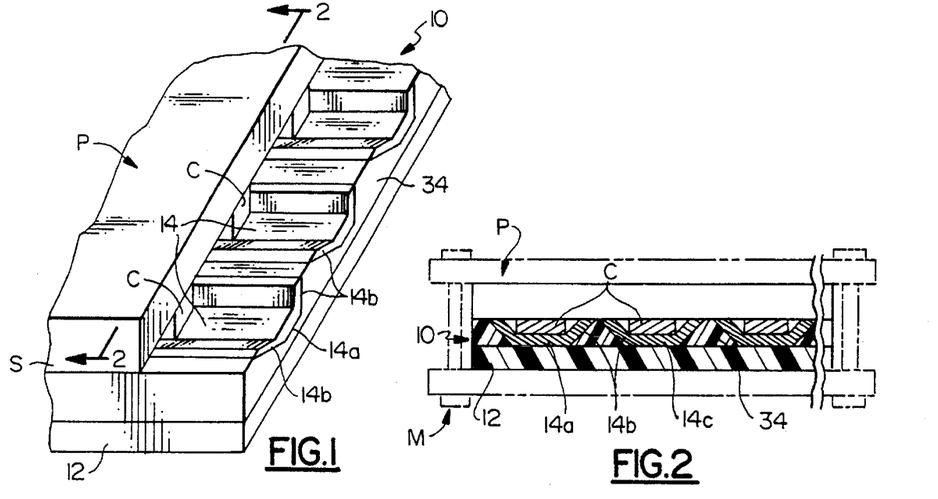

Referring to FIGS. 1 and 2, a flexible conductive network incorporating the invention is shown generally at 10. The network has a dielectric substrate 12 which carries a densely packed cluster of self-aligning conductive paths 14. Conductive network 10 is shown coupled to a more or less conventional conductive network (for example, printed circuit P) composed of a substrate S which supports a set of printed conductive paths or conductors c which are arranged to interfit and interlock with the conductive paths 14 of conductive network 10. The two illustrated networks are connected electrically and mechanical by clamping them together by a suitable clamp shown in phantom at M in FIG. 2. Each conductive path 14 has a bottom wall 14a and a pair of spaced-apart inclined side walls 14b so that the cross-section of each conductive path 14 is trough-like. The bottom wall 14a is generally recessed from about 0.025 mm (0.001 inches) to about 0.125 mm (0.005 inches) below the surface of the conductive network. Due to the special profile or cross-sectional shape of the conductive paths 14, conductive paths 14 interfit or interlock with the corresponding conductors C of circuit P so as to maintain the conductors of the two networks in perfect alignment. The conductive network 10 is best suited for precisely aligning and maintaining contact with conductors which are less than about 3.8 mm (0.15 inches), and preferably less than 0.6 mm (0.025 inches), on center. There is no bridging of adjacent conductors despite their close proximity.

The inclined sides 14b of conductive paths 14 guide the corresponding conductors C into proper alignment with conductive network 10 and provide wiping interconnections between the conductors of the two networks. (It is important to note that the conductive network 10 can be used on either the female contact or the male pin of an interconnection). The trough-like conductive paths 14 also prevent conductor discontinuity under vibration and make high-density connections between the two conductive networks (for example, 10 and P) possible within an established footprint. Note that by adding additional adhesive 34 compliance between the two networks can be enhanced.

Although conductive paths 14 depicted in FIGS. 1 and 2 are shown as being straight and parallel to one another in a closely packed cluster, the conductive paths may have various patterns and follow different paths along substrate 12, or interconnect, depending upon the particular network application, by appropriately controlling the forming operation described below.

Figure 3:
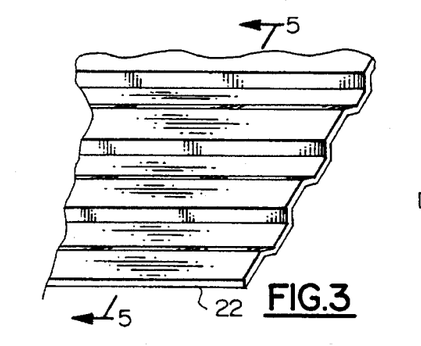
FIGS. 3 and 4 are views similar to FIG. 1 showing successive steps involved in making the conductive network of FIG. 1.
Figure 5:
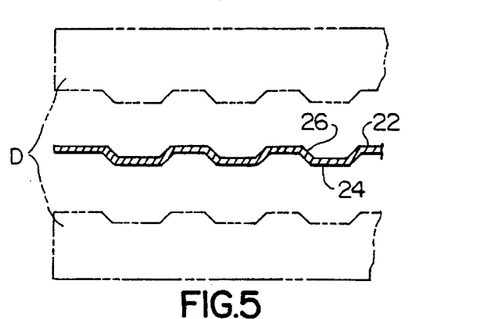
FIGS. 5 and 6 are sectional views taken along lines 5—5 and 6—6 of FIGS. 3 and 4, respectively.

Referring now to FIGS. 3 and 5, according to one embodiment of the invention, to make a flexible conductive network 10, a planar metallic material 22 (for example, copper sheet or foil) of a suitable thickness, for example, about 0.035 mm (0.0014 inches), is cleaned and precisely fed between a pair of coining dies, shown in phantom at D in FIG. 5, which coin or emboss foil 22 to form a non-planar pattern characterized by a set of ridges 24 on one side of the sheet and a corresponding set of troughs or channels 26 in the opposite side of the sheet. Typically, the depth of each trough is from about 0.038 mm (0.0015 inches) to about 0.013 mm (0.005 inches). Although the ridges 24 in FIGS. 3 and 5 are shown as having a rectangular cross-section or profile, the dies D can be designed to provide ridges of any desired cross-sectional shape (for example, hemispherical, ovular, V-shaped, etc). The coining process not only shapes the metallic sheet 22, but also stress-hardens it to prepare the metallic sheet for the lamination step described below. Thin metallic sheets may require the structural support of the forming die during lamination.

Figure 4:
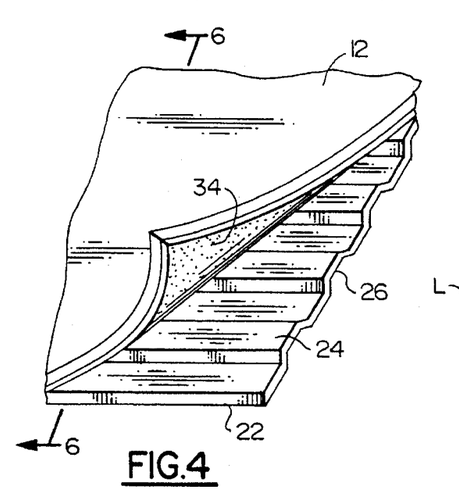
Figure 6:
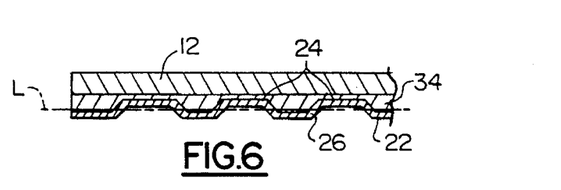

As shown in FIGS. 4 and 6, the flexible dielectric material 12, for example, 0.025 mm (0.001 inch) thick Kapton sheet, can be laminated to metallic sheet 22 during the forming process. The lamination process can also take place after the forming process. In the illustrated laminating process, an adhesive material 34 is adhered to one side of dielectric material 12 and the dielectric material is pressed against the side of metallic sheet 22 having the ridges 24, the appropriate heat and pressure is applied for the prescribed amount of time causing the adhesive material 34 to flow and fill the spaces between the ridges as best seen in FIG. 6. Suitable adhesive materials include, but are not limited to, epoxies, polyesters and other application specific adhesives. Alternatively, the flexible dielectric material may be fused (for example, melted) to the metallic sheet, thereby eliminating the need for an adhesive.

The laminate shown in FIG. 6 is then subjected to a precision metal removal process (MRP) which mechanically removes a predetermined quantity of unwanted metallic material from the exposed metal side of the laminate (for example, the material below the dashed line L in FIG. 6) sufficient to form electrically insulated conductive paths. As a result of the MRP step, there is formed the pattern of profiled conductive paths 14 of conductive network 10 depicted in FIGS. 1 and 2. The conductive paths may then be cleaned and plated with a desired finish coating (for example, gold, lead, or tin) to complete conductive network 10. The conductive paths may be, for example, 0.3 mm (0.012 inches) on center.

Also, in accordance with the invention, by changing the substrate or base materials so that they are rigid rather than flexible, a printed circuit board having channeled or "flat" conductors (as described herein) can be easily constructed in accordance with the preferred particular embodiments of the invention. In this embodiment, the dielectric material would be a rigid dielectric. In other respects, the construction of the rigid circuit board corresponds to the construction of the flexible circuitry as illustrated herein. Accordingly, while the discussion which follows is generally related to flexible conductive circuits, the principles of the circuit manufacturing processes are equally adaptable to rigid circuit boards.

The conductive paths and their terminating points can be designed to any specific electrical parameter (for example, power and signal) or configuration. For example, the controlled impedance of each conductive path can be selected to suit a particular application by appropriately controlling its configuration and/or its relationship to an electrically conductive support structure (for example, a spring layer 58 or shield) if any. It is important to note that although conductors and/or their terminating points can be plated with any surface finish, if a conductor pattern is not electrically connected to a common plating bus, the gold, by example, must be plated on before the conductive paths are electrically isolated.

Further, depending on the use of the conductive network, the conductive paths can be insulated with a prewindowed protective overlay or solder mask. Suitable insulating materials include but are not limited to, Kapton, Mylar and Teflon. This protective overlay provides a means to construct multi-layer conductive networks (for example, multi-layer circuit boards) or to add shielding material to the conductive network.

Figure 7:
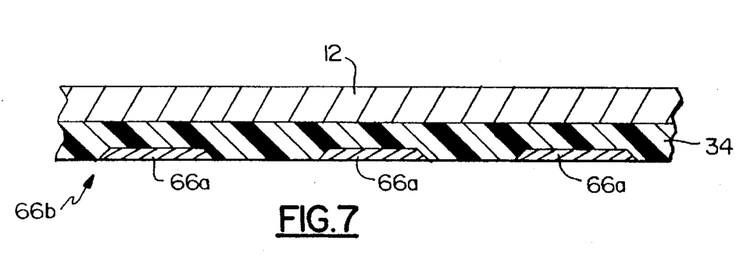
FIG. 7 is a cross-sectional view of a portion of a conductive network in which the side walls have been removed.

In some applications, the channeled conductors may not be required. For example, in building a flexible printed circuit requiring extreme flexibility, the side wall, despite its thinness, acts to reduce flexibility. In this construction, therefore, channelled conductors are a significant disadvantage. Accordingly, referring to FIG. 7, the method for removing the unwanted metallic material, for example the use of a precision diamond tipped flywheel cutter, is continued until the desired thickness of conductor 66a has been achieved. Therefore, referring to FIG. 7, a conductor configuration lacking the side walls in accordance with other embodiments of the invention but retaining the advantages of a chemically free, environmentally safe manufacturing process and the other advantages of the process, results in a structure 66b having significant advantages, and low cost.

Unlike some conventional techniques for fabricating conductive networks (for example, etching and deposition), the process of this invention does not use etchant, environmentally-hazardous resist, stripper, and developer solutions. Thus, the expense and environmental hazards associated with having the resist, stripper and developer waste solutions transported to toxic waste management sites is eliminated. Further, the process of this invention eliminates common yield problems associated with conventional etched circuits, such as: art work distortion, scratched or bad acid resistant ink, inconsistent etching caused by dirt or dust, and questionable etching chemistry. Thus, the use of this process will clearly result in a reduction in labor costs and an increase in product yield.

The process of this invention offers additional advantages over conventional etching processes. The foil used in etching processes must be free of impurities to insure uniform etch rates. However, copper foil with minor inclusions can be used with the process described herein. In addition, the etching process is directly affected by the thickness of the foil because the line speed is directly proportional to the foil weight (the thicker the foil, the slower the line feed).

The process described with reference to FIGS. 1 to 7 allows sharp embosses and fine features.

Figure 8:
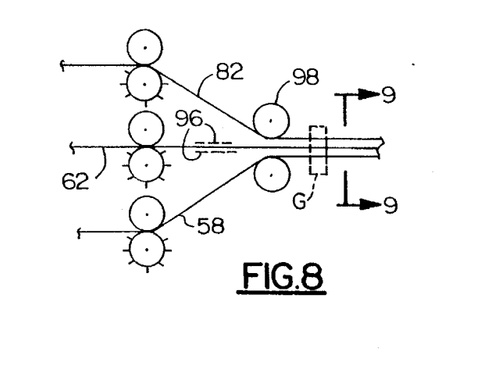
FIG. 8 is a diagrammatic view illustrating apparatus for use in the manufacture of circuits networks of the present invention.
Figure 9:
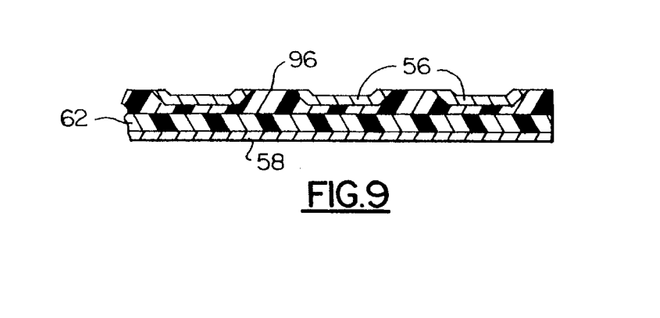
FIG. 9 is a sectional view, similar to that of FIG. 6 with conductors isolated and with a spring backing layer attached for use in connector assemblies.

The coining-laminating-grinding process depicted in FIGS. 8 and 9 is similar to the process used to make the conductive network illustrated in FIGS. 1 and 2. In accordance with this process, a sheet 82 of metallic material, for example, 0.035 mm (0.0014 inch) copper foil, optionally with inlaid pressure fused gold where desired and suitable for electric contacts is drawn from a roll, cleaned and fed precisely between a pair of coining dies D or coining rollers (not shown) which form a pattern of ridges and waste areas, the pattern corresponding to the pattern of contacts or conductors 56. The inlaid gold strips will form contact areas. Preferably, the sheet 82 is provided with sprocket holes which register with sprockets in a feed mechanism (not shown) so that the strip is guided precisely to the proper location between dies D. This coining process embosses the unwanted or waste sheet areas approximately 0.05 mm (0.002 inches) to 0.125 mm (0.005 inches) above the surface of ridges defining conductors 56. The forming process effected by the dies D also stress-hardens the raised waste areas of the foil between the ridges which strengthens the sheet 82 in preparation for the in line laminating process described below.

As shown in FIGS. 8 and 9, the preformed metallic sheet 82 is next registered to a sheet 58 of spring metal (for example, beryllium copper) drawn from a roll, such that the waste areas 86 of the foil face away from the sheet 58. Fed in between sheets 58 and 82 is a sheet 62 of a flexible dielectric material (for example, 0.001 polyester) which may be pre-punched (windowed) to expose ground connections and/or pressure fused interconnecting points. If desired, pressure fused interconnections can be made as the two conductive sheets, each having opposing stress hardened domes located at the points to be interconnected, pass between the high pressure nip rollers. This is accomplished as the two sheets of conductive material are registered to each side of the pre-punched flexible dielectric material. The opposing stress hardened domes are pressure fused as they pass through the high pressure nip rollers. In addition, each interconnect is structurally reinforced through the laminating process as described in more detail below. The laminate so produced provides a spring backing for use in connector construction and may also be used to provide shielding and/or a ground plane.

An adhesive material 96, in this illustrated embodiment, is provided on both faces of sheet 62 so that when the three sheets are pressed together by the nip rollers 98, they become laminated forming a single composite sheet consisting of the conductive top layer 82, the intermediate dielectric layer 62 and the bottom spring layer 58, with the adhesive material 96 filling the spaces under the metal waste areas 86 of layer 82. In other embodiments, the dielectric layer 62 can be fused or melted without causing conductor distortion (swim), thereby eliminating the need for an adhesive between layer 62 and the conductive top layer 82.

According to the next step of the process, the laminate is fed through a precision grinding polishing or milling station shown in phantom at G in FIG. 8 which removes some, for example, 0.038 mm (0.0015 inches), of the raised waste areas of sheet 82, as well as some of the adhesive material 96 thereby electrically insulating the adjacent ridges and establishing the final shapes of those ridges which now correspond to the patterns of conductive paths 56.

It is noted from the foregoing that the process of this invention allows the production of fine-line flexible conductive networks (for example, circuits and jumpers) and conventional, high volume, printed circuit boards at relatively low cost. The same principles may be followed to produce densely-packed contact clusters for incorporation into connectors used to interconnect such fine-line circuits.

In a particular embodiment for terminating a device conductor terminal, a portion of the recessed conductive paths can act as solder wells, that is, contain a volume of solder. Upon mounting (and heating), the solder well(s) provide a permanent connection to the device conductor(s), and the conductor recess provides tolerance for any non-planarity between the device and the conductor, which, being self-aligning, aids in the placement of the conductor terminals. The recessed conductors also help to reduce solder bridging (between conductors) and solder balls.

Figure 10:
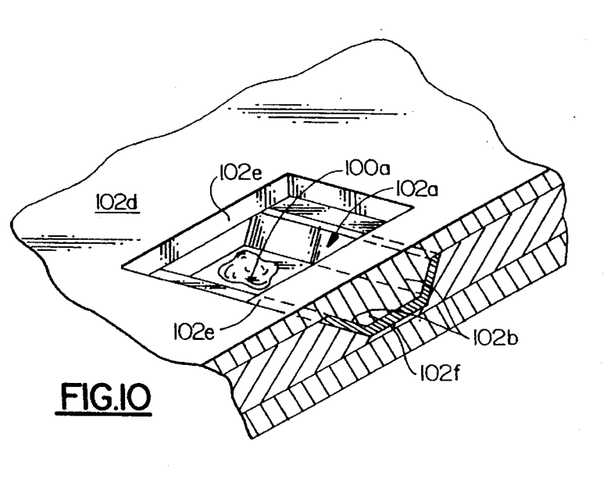
FIGS. 10 and 11 are perspective and top views respectively illustrating the use of the conductive network for holding a reservoir of solder.
Figure 11:
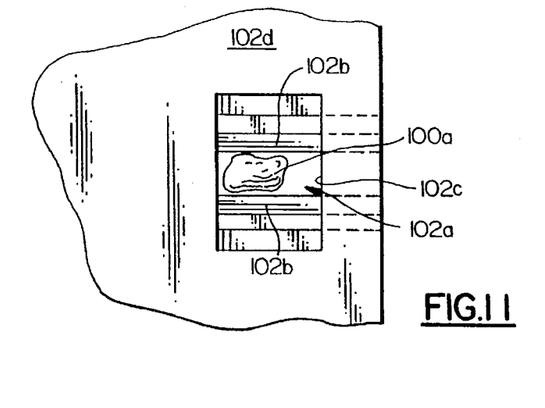

Referring to FIGS. 10 and 11, in a typical configuration (only a single conductive path is illustrated although plural conductors are generally used), the solder 100a is placed in a recessed pocket 102a. The illustrated recessed pocket is formed by the inclined side walls 102b of the conductive path, and either a third terminal ending side wall 102c (FIG. 11) and dielectric insulating layer 102d, or a dielectric layer 102d blocking both ends 102e of the pocket (FIG. 10). In either configuration, heat is then applied, the solder melts in place, and the device terminal is inserted for electrical connection to the conductive path 102f. Alternatively, the blocking members can be omitted, if desired.

Figure 12:
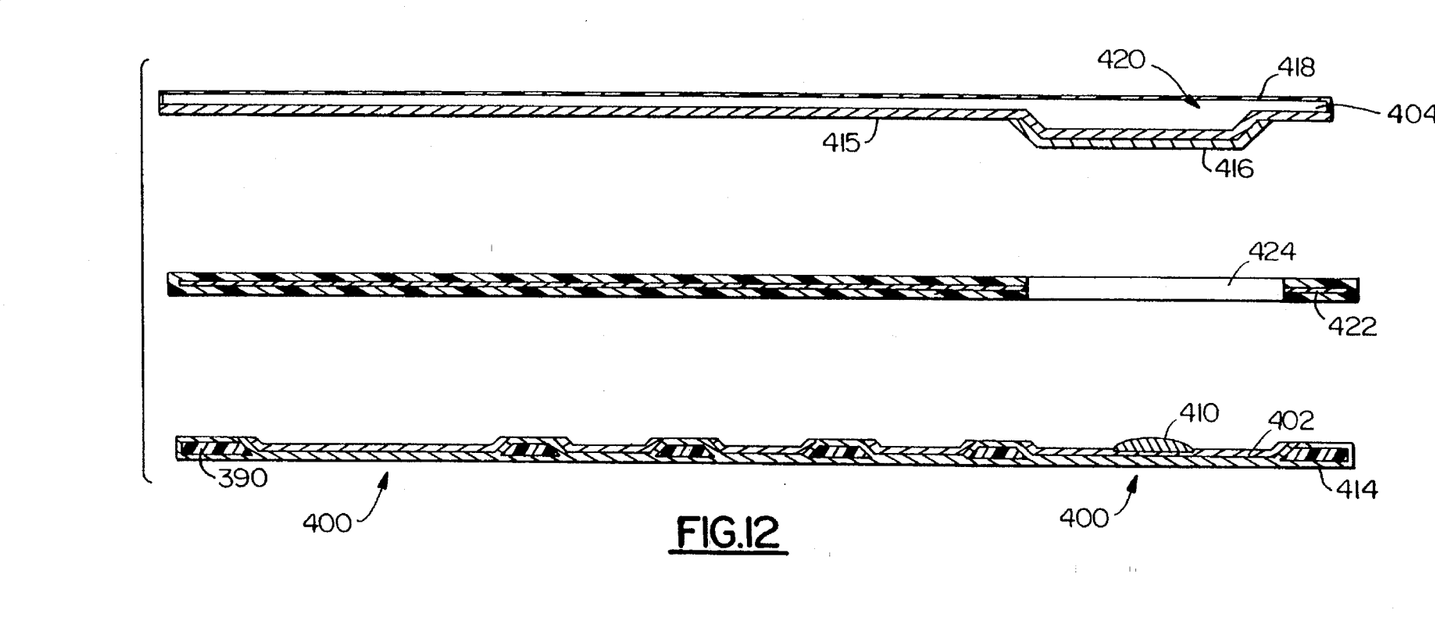
FIGS. 12 and 13 are sectional views illustrating a cold pressure fusing operation.
Figure 13:
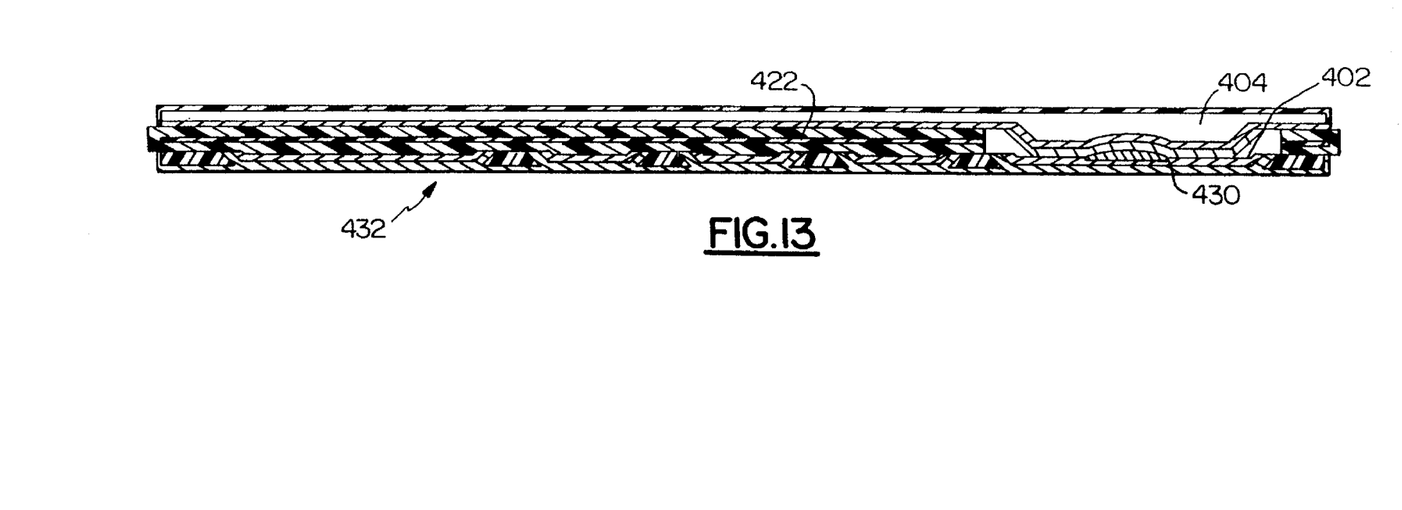

Referring to FIGS. 12 and 13, according to one particularly preferred implementation of a pressure fused interconnection between two conductive sheets, in accordance with the invention, a dielectric 390, for example 0.001 inches Kapton with polyester adhesive on either side, is prepunched at 400 to allow a connection between a gold plated copper foil 402 and a conductive shield material 404. In this process, the copper foil is provided with a force concentrator 410 at the location where the pressure fused interconnect is to be made. The force concentrator has been stress hardened and may be back filled with adhesive to further increase its strength and insure its ability to fuse without collapsing. The prewindowed Kapton is laminated to the formed copper and, in accordance with the manufacturing process described above, the upper surface layer of the copper laminate is ground off. The force concentrator 410 has a height preferably below the level of grinding so that it neither interferes with the grinding process nor is itself ground.

The thus formed conductor circuit 414 with force concentrator(s) is assembled with the shield material 404 formed, for example, of a copper sheet 415 having a plated interconnect point 416 and an insulating layer 418 connected to the shield material through an adhesive layer 420. A prewindowed adhesive layer 422, windowed or drilled at 424 to expose the interconnect point 416, is placed between the shield material and the formed circuit 414 and the assembly is laminated in place. During the lamination process, the force concentrator effectively increases substantially the force between the plated interconnect point 416 of the shield and the conductor 402 of the formed circuit 414 to effect a pressure fused interconnection at 430 for the assembled circuit 432. Typical pressure required for this interconnection is on the order of 275–425 psi. In this manner, according to this illustrated embodiment, a conductor of the invention can be connected to a shield member with its advantageous electrical properties.

Figure 14:
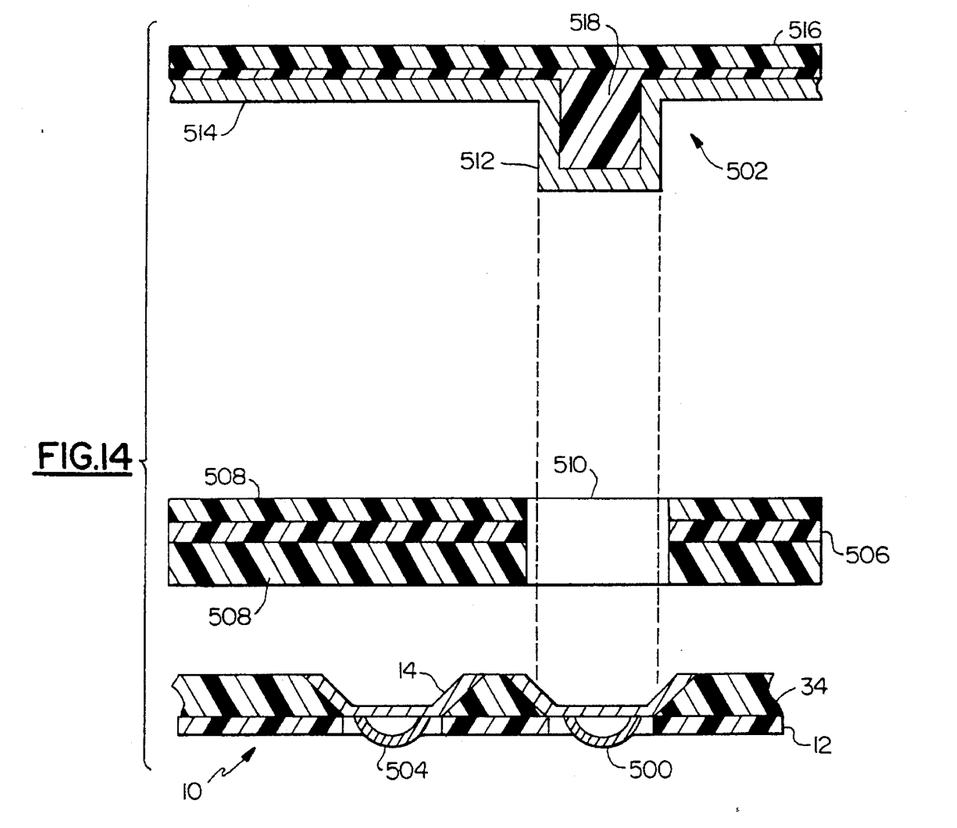
FIGS. 14 and 15 are, respectively, sectional views of the components of and the assembled construction of a conductive network according to the present invention incorporating stress hardened pads and a shield.
Figure 15:
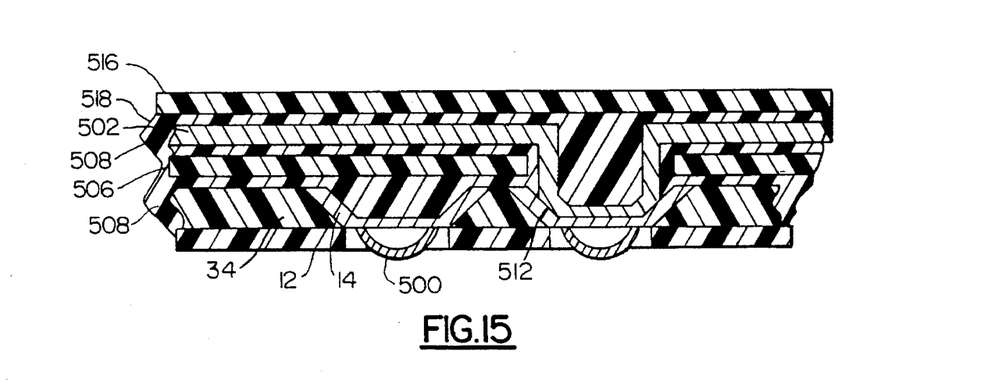
Figure 16:
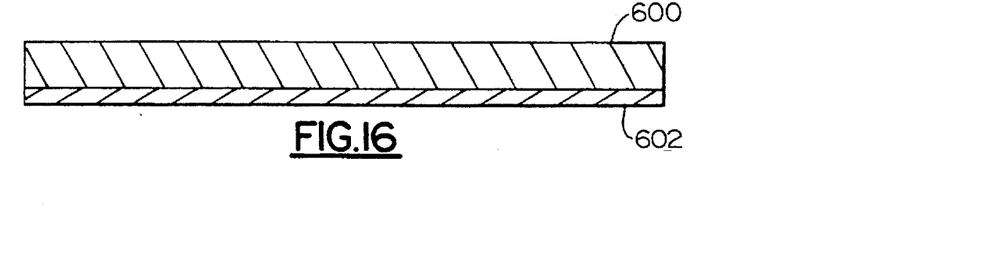
FIGS. 16 to 19 illustrate the process for making an SCN according to a further embodiment of the invention.
Figure 17:
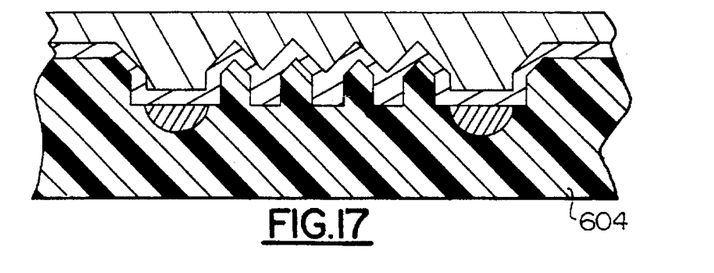

Referring now to FIGS. 14 and 15. Illustrated in FIG. 14 are the components of a circuit (SCN), in accordance with the present invention, incorporating a stress hardened pad 500 and a shield 502. The conductive network 10, includes in this construction, gold plated contact areas 504 which form contact areas of the stress hardened force concentrators 500. The interior of this concentrator comprises copper which is part of the laminae of the copper sheet from which the conductors were formed.

Disposed for attachment to the conductor 14 side of the conductive network 10 is a layer of dielectric material, for example, Kapton 506, having on both surfaces an adhesive 508 by which the layer of dielectric material will be attached to the conductor 14 side of the circuit network 10 and the shield 502 to form the structure of illustrated in cross-section in FIG. 15. The dielectric 506 and its associated adhesive layers 508 include openings or windows 510 permitting a pressure post 512 of the shield 502 to pass to provide contact between the metallic shield 514 of the shield 502 into contact with portion of the circuit network 14 in order that it may be fused to that circuit portion by the application of pressure. The shield 502 is backed by a layer of dielectric material (Kapton) 516, which is attached to the shield material by an adhesive layer 518. This adhesive also fills the interior of the pressure post 512.

The stress hardened force concentrators 500 may be used to produce pressure fused interconnects, such as were described earlier with respect to FIGS. 12 and 13, in order to interconnect the structure illustrated in FIG. 15 with further conductor layers or with connector structures, printed circuit boards etc.

Figure 18:
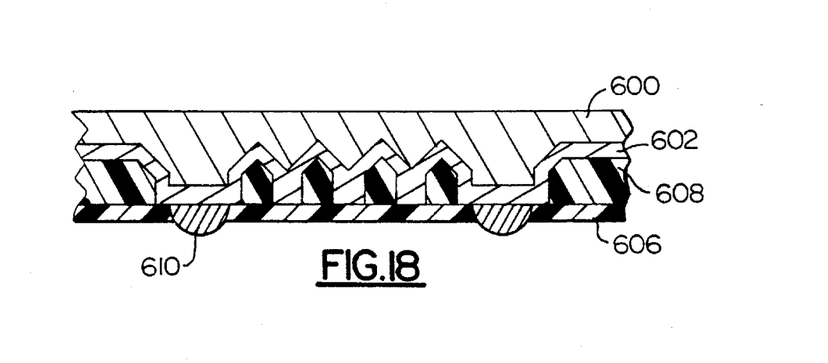
Figure 19:
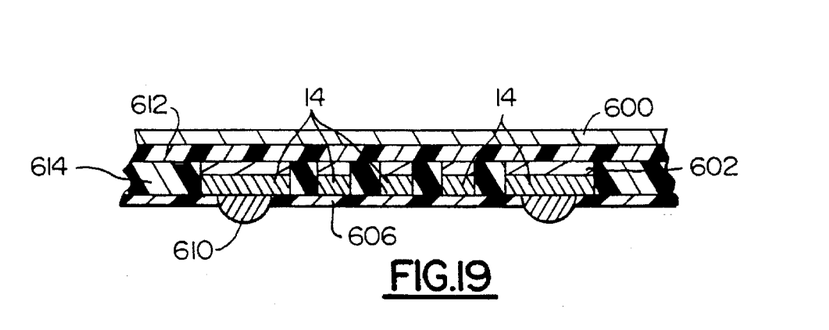

An embodiment utilizing a different process for forming the circuit network itself is illustrated in FIGS. 16–19. In this embodiment, this network is formed from a laminate comprising a relatively thick layer 600 of aluminum onto one face of which has been deposited a relatively thin layer 602 of copper. In a typical example of such a laminate, the aluminum may be 0.25 mm (0.010 inches thick) and the copper approximately 0.025 mm (0.001 inches thick). Alternative materials could be utilized depending upon the application. These might include gold or conductive ink. In addition contact forming areas of gold might be selectively deposited upon the copper layer. The laminate 600, 602 is formed in a stamping or rolling operation by a negative template 604 into which the laminate is forced by pressure with the copper layer contacting the negative template 604. This action produces an intermediate structure as shown in FIG. 18 to the copper side of which has been attached a prepunched dielectric layer (for example, Kapton) 606 by means of an adhesive 608 which fills spaces between the formed copper layer and the dielectric layer 606. Force concentrators 610, intended for connection to other circuit parts or components by appropriate means including pressure fusion, project through the openings or windows of the dielectric 606.

The exposed aluminum layer 600 and desired portions of the copper layer 602 are then removed by appropriate machining, as herein before discussed, to isolate the conductors 14 which comprised areas of the copper layer 602 backed by reinforcing portions of the aluminum layer 600 (FIG. 19) to which is adhesively attached a dielectric layer (for example, Kapton) 612 by a suitable adhesive 614.

As an alternative to the use of the laminate described with reference to FIGS. 16–19, the positive circuit network pattern could be formed from a solid sheet of copper or other appropriate material with the dielectric layer then being adhesively attached to the positive circuit pattern and the waste backing machined way to leave the isolated circuit elements 14. These may be formed with the force concentrators or without or as appropriate in the particular construction. By using this method to create a conductor pattern force concentrators can be created by continuing to selectively reduce (grind) the conductor to a lower level than the force concentrator.

In the process described with reference to FIGS. 16–19 and the subsequent description with alternative material, it is important to note that the aluminum layers 600 or the thick copper layer are primarily designed to act as a hydraulic cushion and support structure with the circuit feature being formed on the surface of the layer as an integral part thereof whereby these features may be accurately positioned and retained for subsequent operations such as heat treating, laminating, plating, etc.

This may prove to be the best method for forming intricate details and/or large "Z" axis features but with the disadvantage of greater waste metal, etc.

In a further embodiment, the conductive network of the present invention may be produced by utilizing a thin layer of copper or other conductive material, approximately 0.0125 cm (0.0005 inches) backed with a layer of thermoplastic material approximately 0.25 mm (0.010 inches). In this embodiment, the copper becomes the circuit network while the thermoplastic acts as a hydraulic cushion and processing support structure. This laminate is processed in a manner similar to that described with respect to the laminate comprising aluminum and copper. The thermoplastic material may be adhesively attached to the copper or may be injection over-molded onto the layer of copper.

In embodiments in which the dielectric material is adhesively attached to the copper, the circuit pattern may be formed in the copper layer with the dielectric material undeformed. Here the adhesive is displaced to allow the pattern formation and to fill the voids otherwise produced.

In one form of this embodiment the copper or other conductive layer may be formed against a negative template formed in an injection mold by the pressure exerted by a dielectric material injected into the mold to form a laminate with the conductive simultaneously with the forming step.

As will be appreciated, the process of the present invention is very versatile and permits the creation of a conductive pattern in one or more of the various embodiments herein described as well as the following further embodiment in which a conductive material is laminated to a dielectric with the resulting planar laminate, which may be any commercially available laminate, formed to produce a conductive network. The laminate may be a sheet of dielectric coated, sprayed or plated with a thin conductive material or imprinted (molded, heat formed, stress formed, vacuum formed) by a template or scribe designed to force or draw the conductive material into an upper and lower level with the lower level being sufficiently below the upper level to avoid damaging it as the top level is removed. In this embodiment, the upper and lower levels (the contouring or embossing) are produced after the laminate itself has been produced. Typically such a laminate may comprise a sheet of dielectric material (for example, Kapton) 0.0127 mm (0.0005 inches) thick with a layer of copper 0.0063 mm (0.00025 inches) thick which is simply vacuum formed to produce the laminate and conductive pattern into a shallow template. The template allows the laminate to be formed with the conductor network sufficiently below the top level to avoid damaging that conductor network as the top level is removed by grinding, cutting or polishing etc. After the waste removal, the laminate may be rolled flat to create the desired circuit configuration. Alternatively, the deformation stress as applied to the laminate may be arranged to be insufficient to cause permanent deformation as a result of which, following grinding, cutting or polishing while the laminate is held deformed in the template, the vacuum is released and the conductor network returns to its original flat planar condition. Laminates for this purpose may be produced as, for example, conductor clusters vacuumed formed and laminated to a sheet dielectric using an adhesive layer or conductor clusters deformed and infusion bonded (melted) to the base dielectric layer thereby eliminating the need for an adhesive. This can only be accomplished at the present time, without causing conductor distortion (swim) using a process according to the present invention. This method may be quicker and therefore cheaper process possibly, limited in detail formation since the existing dielectric acts as the forming "driver" which could be a limit.

The present invention also permits the production of sculptured (3 dimensional) circuit networks in which portions of the network are thicker than others thereby to provide, for example, rigid contact areas with flexible interconnects. This is accomplished by creating the appropriate three dimensional template which includes the desired features, for example see FIGS. 16–19, utilizing a conductive material or composite material laminate, which is then formed as hereinbefore described with reference to FIGS. 16–19.

Conductor networks and/or their terminating points can in accordance with the present invention, be plated with any surface finish because the present invention has the ability to manufacture conductor networks from a sheet or roll of conductive material on which a suitable contact finish (for example, gold) has been previously placed or inlaid. This approach is only practical with the process of the present invention as the process mechanically defines each conductor by grinding off unwanted waste material between each conductor thereby easily removing any unwanted gold. This contrasts sharply with conventional etching systems used to create printed circuit boards as conventional etching solutions will not remove gold and therefore would require additional processing steps. Consequently, the present invention significantly reduces both costs of applying and selectively removing the desired contact finish.

The conductive network can be insulated with a protective overlay, if required, and may be used to produce multi-layer circuit boards overlaying one another with appropriate protective intermediate dielectric material insulating the boards except where contact is desired through openings or windows.

As previously mentioned, pressure fused interconnections can be easily created to join two conductive sheets, one of which has stress hardened domes located at the points to be interconnected, using high pressure rollers. This is accomplished with the two sheets of conductive networks registered to each side of a prepunched windowed flexible dielectric layer. The flexible dielectric material, for example, 0.025 mm (0.002 inches) thick, may be polyester. The stress hardened domes produce pressure fused interconnections as they pass through the high pressure rollers. In additional each interconnect is structurally reinforced by the laminating process.

I claim:

1. A method for manufacturing a supported conductive network comprising the steps of:

a) providing a flexible laminate comprising an electrically conductive layer and a dielectric layer, the laminate being sufficiently pliable to be deformed by a partial vacuum;

b) forming the laminate into a non-planar pattern having a dielectric material fast with a first face thereof by applying such a partial vacuum to the dielectric layer to draw the laminate against an appropriately contoured surface; and b) removing portions of the laminate from a second face thereof to form electrically insulated electrically conductive paths supported by the dielectric material.

2. The method of claim 1, wherein the laminate is sufficiently resilient to return to a planar form when released from the contoured surface.

3. The method of claim 1, comprising the step of pressing the laminate into a planar form after the raised portions are removed and after release of the laminate from the contoured surface.

4. The method of claim 3 wherein the raised portions are removed while the laminate is held against the contoured surface by the partial vacuum.

5. A method for manufacturing a supported conductive network comprising the steps of:

a) forming a planar electrically conductive sheet into a non-planar pattern having a dielectric material fast with a first face thereof;

b) removing portions of the sheet from a second face thereof to form electrically insulated recessed electrically conductive paths supported by the dielectric material; and c) blocking at least one of said conductive paths to isolate at least one pad portion of a path for receiving a solder volume.

\* \* \* \* \*